Jan. 29, 1963 M. R. BOYD 3,076,117

PARAMETRIC ENERGY CONVERTER

Filed April 27, 1959

Inventor:
Malcolm R. Boyd,
by Richard R. Brainard
His Attorney.

United States Patent Office 3,076,117
Patented Jan. 29, 1963

3,076,117
PARAMETRIC ENERGY CONVERTER

Malcolm R. Boyd, Schenectady, N.Y., assignor to General Electric Company, a corporation of New York Filed Apr. 27, 1959, Ser. No. 809,228
6 Claims. (Cl. 315—5.43)

Figures 1, 2, 3:
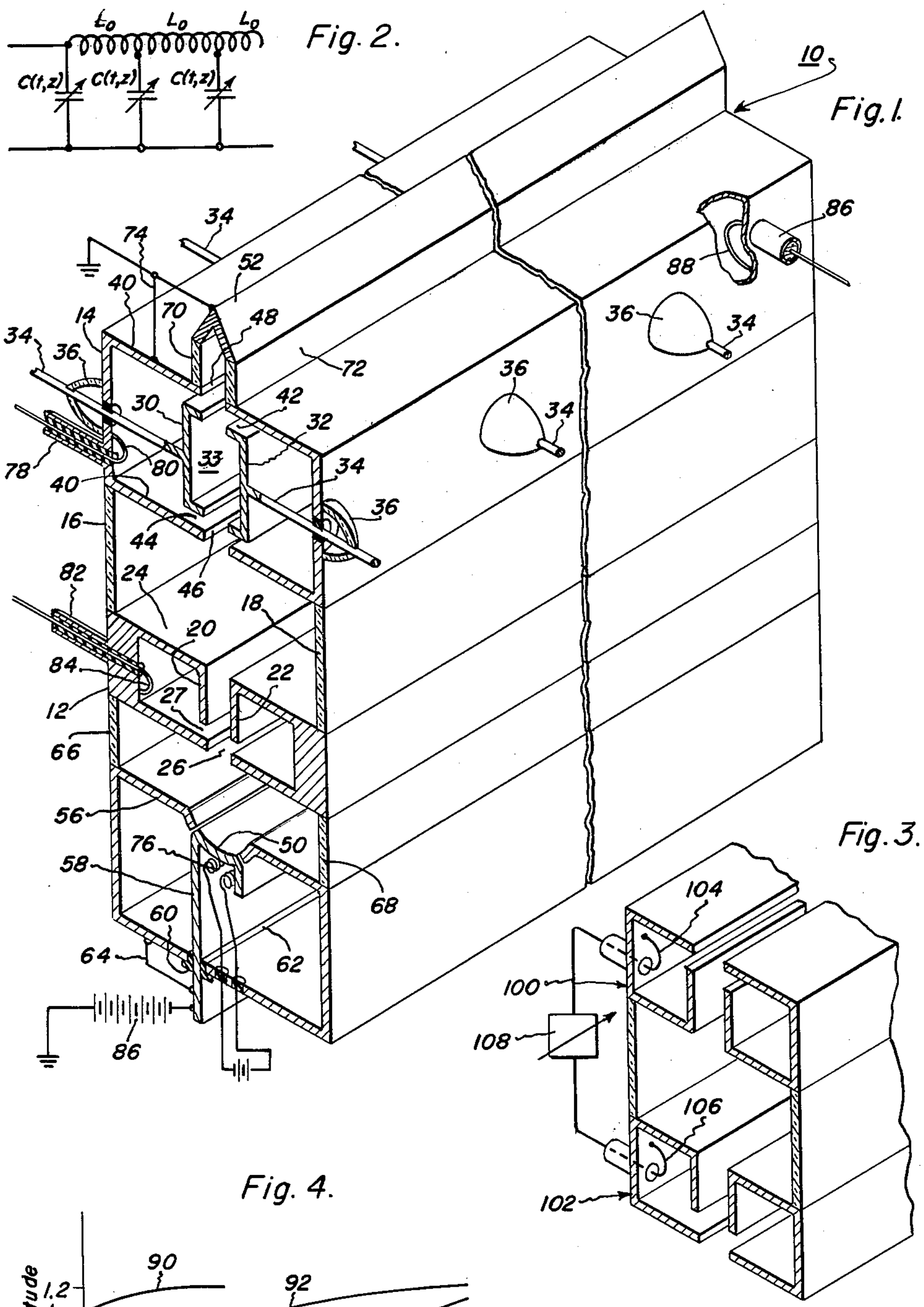

This invention relates to an electron discharge apparatus of the type effective to achieve energy conversion by control of a circuit parameter.

It is known that energy conversion can be effectively achieved by the appropriate variation of a circuit parameter such as the inductance of an inductor or the capacitance of a capacitor while an input signal is being applied thereto. Such parameter variation in presently known apparatus is effective to produce amplification of the input signal or the generation of higher frequencies and the energy required for these functions is derived from the parameter variation source, commonly called the "pump." Such parameter variation to achieve these results is particularly practical at microwave frequencies where certain advantages inherent in parametric energy conversion result in low noise contributed by the process and this leads to high signal to noise ratio in the output circuit. Various elements having parameters adapted for periodic variation exist and include the variable inductance of certain ferrites, the capacitance of reverse biased p-n semiconductor diodes, and the capacitance across gaps in cavity resonators through which bunched electron streams may be passed. These elements have been utilized in achieving energy conversion, such as frequency multiplication or amplification, in each of the hertofore known structures for producing such parametric energy conversion. However, in many of these structures, the circuit parameters are either lumped or are limited to operation at certain discrete frequencies rather than at any frequency over a band or at any frequency greater than a predetermined minimum value. In circuits employing cavity resonators, the same are operable at certain frequencies of resonance of the cavity and at higher modes thereof and are not useful at frequencies intermediate to these frequencies. In addition to this drawback, a large number of cavities of different sizes are required for accommodating or producing a relatively large number of frequencies.

It is accordingly a principal object of my invention to facilitate parametric energy conversion, including amplification and frequency conversion, at frequencies greater than a predetermined minimum value.

It is another object of my invention to facilitate the production of electromagnetic wave energy at frequencies harmonic to a signal wave in a parametric energy converter.

It is another object of my invention to facilitate the production of electromagnetic waves of frequencies equal to the sum of the signal frequency and frequencies harmonic to a pump frequency in a parametric energy converter.

It is still another object of my invention to facilitate the production of electromagnetic wave energy at frequencies as mentioned in the two next preceding objects in simple, small and compact electronic apparatus.

In accordance with my invention, parametric energy conversion is achieved by electronically varying the susceptance of a wave guide along which electromagnetic wave energy may be propagated. A sheet electron beam is caused to traverse spaced longitudinal gaps of a pair of wave guide means coupled together in the proper phase and which may simply be a doubly ridged wave guide wherein the spacing between gaps is so coordinated with the velocity of electron bunches formed at the first gap and with electromagnetic wave propagation along the wave guide, to produce a susceptance across the wave guide at the second gap. For a variation of the susceptance, the beam may be modulated in accordance with a pump signal varying the intensity of the electron beam prior to its passage through the first gap of the doubly ridged wave guide. In this arrangement, the characteristics of the wave guide are similar to that of a transmission line have distributed parameters and is effective to produce waves having frequencies equal to the signal frequency, the pump frequency and the sum and difference of the signal frequency and harmonics of the pump frequency, which progressively increase in magnitude along the length of the wave guide. As a feature of my invention, a "compression" of waves so produced is achieved wherein the length of wave guide required for a predetermined magnitude of a given frequency component varies logarithmically as the harmonic order.

Figure 4:
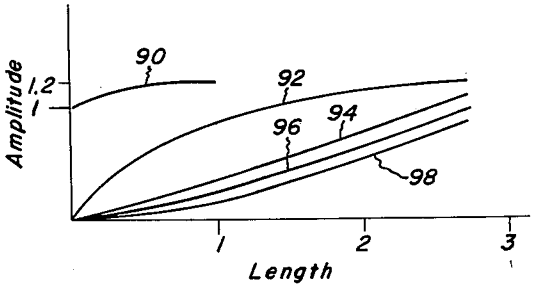

The novel features believed characteristic of the invention are set forth in the appended claims. The invention itself, together with further objects and advantages thereof, may best be understood with reference to the drawing in which:

FIG. 1 is a perspective view showing schematically an embodiment of my invention, FIG. 2 is a representation of a transmission line having distributed parameters similar to the wave guides of FIG. 1 including time and distance variable capacitance, FIG. 3 shows a modified form of my invention, and FIG. 4 is a graph illustrating the characteristics of "compression" of the parametric energy converter of my invention.

Referring now to FIG. 1 of the drawing, 10 represents generally the entire apparatus of my invention which according to a feature thereof includes principally a pair of wave guides 12 and 14 shown as being of generally rectangular cross section disposed in parallel spaced relationship along their lengths by insulating ceramic members 16 and 18 bonded to the wave guides at adjoining surfaces. According to my invention, in the general case, the internal width of wave guide 12 is smaller than that of wave guide 14 whereby the cut off frequency of wave guide 12, viz., the lowest possible frequency capable of being propagated in the wave guide, is greater than the cut off frequency of wave guide 14. Wave guide 12 is provided with a pair of spaced ridge-forming members 20 and 22 extending into the wave guide from edges of a slot in one wall 24 thereof. The members 20 and 22 terminate near the edges of the slot 26 in the wall 28 opposite to wall 24. Thus, the edges of members 20 and 22 and the edges of slot 26 are spaced to form an electron bunching gap 27 as set forth in detail hereinbelow. Wave guide 14 is provided with spaced ridge-forming members 30 and 32 forming a drift space 33 therebetween and supported to the interior of the wave guide by a series of rods as shown at 34. The rods are secured at their inner ends to the respective ridge-forming members and are secured in insulated relationship to the wave guide walls at their other ends. Insulators as shown at 36 which may be of glass or other suitable material, may be provided for such insulation. One or more of the rods at either side of the wave guide may be extended beyond the insulator 36 for facilitating the electrical connection to the members 30 and 32.

The ridge-forming members 30 and 32 are spaced at their inner ends from respective walls 38 and 40 of the wave guide 14 to form respective gaps 42 and 44 and the opposite walls 38 and 40 are slotted along their length as shown at 46 and 48, respectively. The ridge-forming members are spaced from each other by approximately the same distance as the width of the wall slots 46 and 48.

For establishing an electron beam, an elongated, trough-shaped cathode 50 extending along the length of the wave guide is disposed at one side of wave guide 12 remote from wave guide 14 and a collector electrode 52 is provided at one side of wave guide 14 remote from wave guide 12. The cathode and collector are in alignment with each other through respective wave guide slots through the spaces between members 20 and 22, and drift space 33 to accommodate an electron beam between cathode 50 and collector 52. To aid in forming the beam the cathode is concaved toward the collector and a generally hollow focusing electrode 56 coextensive with the cathode and having an open side for receiving the cathode is mounted with surfaces adjacent to the cathode forming arcuate extensions on each side thereof. The cathode is supported from a wall of the focusing electrode opposite its open side by a sheet member 58 integral with the cathode and coextensive therewith. The sheet member and cathode are electrically insulated from the focusing electrode 56 by insulators 60 and 62 therebetween for applying a potential bias between the cathode and the focusing electrode. However, for present purposes the cathode and focusing electrode may be electrically interconnected as shown by wire 64. The focusing electrode 56 is supported in spaced relationship from wave guide 12 by insulating members 66 and 68 bonded to the wave guide and the focusing electrode at adjacent surfaces. The collector electrode 52 may be formed integral with wave guide 14 or may be insulated therefrom by insulators 70 and 72 and for the present purposes is interconnected with wave guide 14 in any suitable manner as shown by wire 74. The cathode is preferably coated with a suitable thermionic emission enhancing material and a heater shown at 76 is provided for elevating the temperature of the cathode to that necessary for copius thermionic emission.

For introducing an electromagnetic wave signal into wave guide 14, a coaxial line 78, having its inner conductor terminating in an inductive loop 80, the end of which is connected to the inner wall of the wave guide, is provided. The outer conductor of coaxial wave guide 78 is conductively connected to the exterior of the wave guide 14. A pump signal may be introduced into wave guide 12 by coaxial wave guide 82 having its inner conductor terminating in an inductive loop 84 connected at its end to an inner wall of the wave guide 12 and its outer conductor conductively connected to the exterior of the wave guide 12.

In operating the apparatus of my invention, heater 76 is energized to raise cathode 50 to a temperature of copius thermionic emission and the cathode is made negative with respect to ground by a direct potential source as shown at 86 having its negative terminal connected to the cathode and its positive terminal grounded. The collector electrode 52 is grounded and thus the potential of source 86 appears between cathode 50 and collector 52. The value of potential impressed on cathode 50 may be of the order of 1000 volts under circumstances wherein collector 52 is spaced approximately 3 inches from the cathode.

An input wave is introduced into wave guide 14 through coaxial line 78 and loop 80 and the wave is propagated along the length of the wave guide. As is well known, the electric field in a ridge wave guide is most intense between the portions of the ridge and the adjacent wall of smallest spacing and thus, in the present invention, the electric field is most intense in the gaps 42 and 44. The variations of electric field of the input wave across gap 44 are effective in a known manner to produce bunching of electrons in a beam passing therethrough. During portions of a cycle, due to the electric field variation across the gap, certain electrons are electrically accelerated more than others whereby the faster moving electrons in the drift space 33 reach the slower moving electrons to produce bunches of the electrons as they pass through the gap 42. The members 30 and 32 and the drift space 33 are proportioned in relation to the velocity of the electrons and to the properties of the input signal so that electrons subjected to bunching influence at gap 44 are most closely bunched at gap 42 and are passing through the gap at a time when the instantaneous voltage across the gap 42 is zero. At the frequency of the input signal, the intergap spacing corresponds to an integral number of half wavelengths to provide a pure susceptance. Thus, the maximum current passes in the beam in gap 42 at a time of zero voltage which are the conditions for introducing a susceptance into the waveguide. By introducing a modulating wave in wave guide 12 through coaxial line 82 and loop 84, the electron beam may be modulated and the susceptance presented to wave guide 14 accordingly modulated. The electron beam is thus used to effectively vary a parameter of the wave guide 14 thus giving rise to parametric energy conversion of energy propagated along the wave guide 14. For coupling wave guide 14 to an output circuit, a coaxial wave guide 86 having its inner conductor 88 terminating in a loop connected to an interior wall of wave guide 14, is provided. The longitudinal portion of loop 88 may be selected for desired output signal strength. The action described, occurs along the entire length of the wave guides, it being understood, however, that time and space variation of the intensity of the waves propagated in the wave guides occurs and that the action described therefore, also varies along the line in a cyclical manner.

In the operation of my invention an electron beam between cathode 50 and collector 52 is established in the manner hereinabove explained and an input signal is introduced into wave guide 14 through coaxial line 78 and loop 80. Under these circumstances the bunching of the electron beam between gaps 42 and 44 is also effected in the manner hereinabove set forth. A pump signal is introduced into wave guide 12 along coaxial line 82 and loop 84 and the electron beam is modulated by the pump signal propagated along the wave guide 12. The susceptance of wave guide 14 is modulated or varied as hereinabove explained and the effect of this susceptance may best be understood by reference to and analysis of the equivalent circuit of wave guide 14 shown as being a transmission line in FIG. 2 of the drawing. In this transmission line the distributed parameters are indicated as being lumped parameters $L_0$ and $C(t,z)$ which are, respectively, the inductance per unit length of the transmission line and the capacitance between respective lines per unit length. As is indicated, the value of inductance is a constant value per unit length but the value of shunt capacitance or susceptance thereof is a function of time ($t$) and position along the line ($z$). The differential equation of performance for the circuit of FIG. 2 which also applied to the apparatus of FIG. 1 is as follows:

$$\frac{\partial^2 V}{\partial z^2}-L_0\frac{\partial^2(CV)}{\partial t^2}=0$$

In the general case wherein the relationship between wave guides 12 and 14 is merely that the width of wave guide 12 is smaller than that of wave guide 14 and the pump signal frequency is larger than the input signal frequency, the solution of this equation indicates that the frequencies produced in wave guide 14 are the pump frequency designated $f_p$, the signal frequency designated $f_s$, and the respective sums and differences of the signal frequency introduced into wave guide 14 and the different harmonics of the pump signal introduced into wave guide 12. That is, the frequencies follow the series: $f_p$, $f_s$, $f_p+f_s$, $f_p-f_s$, $2f_p+f_s$, $2f_p-f_s$, $3f_p+f_s$, $3f_p-f_s$. In the degenerate case, however, wherein the frequency of the pump signal introduced in wave guide 12 is exactly twice the frequency of the input signal, odd harmonics only, of the input signal, are produced. Further analysis of this system indicates that the waves produced are propagated in synchronism and that there is a compression in the order of waves which are generated. That is to say, the length of line required to generate a certain amplitude of a given number of harmonic, for example, is considerably less than the product of such number times the length of the line required to generate the same amplitude of fundamental and moreover, the multiple of the length of line progresively decreases as the order of harmonic is increased. This is graphically illustrated in FIG. 4 of the drawing, wherein the ordinate represents the amplitude of the wave under consideration and the abscissa represents the length of the line in terms of multiples of the length required for the fundamental to reach predetermined value here taken to be the amplitude of the input signal. Curve 90 represents the amplitude of the input signal which is inserted at an amplitude which may be taken as unity, and curves 92, 94, 96 and 98 represent, for example, the amplitudes of representative waves harmonic to the input wave and here may specifically represent the third, fifth, seventh and ninth harmonic waves. It can be thus shown that the length of tube required to generate a given level of a certain harmonic, for example, need be only the logarithm of the length of the tube required to generate the same amount of a lower harmonic.

According to another embodiment of my invention as shown in FIG. 4, rather than utilizing a doubly ridged wave guide as shown at 14 in FIG. 1, a pair of singly ridged wave guides 100 and 102 may be disposed in parallel spaced relationship with gaps formed in the ridged portions thereof to accommodate the sheet beam of electrons produced as above described. To produce the proper action for parametric energy conversion, the wave guides are coupled together through loops 104 and 106 and a suitable phase control means 108. In other respects, the construction and action of the converter may be the same as described hereinabove.

While the present invention has been described by reference to particular embodiments thereof, it will be understood that numerous modifications may be made by those skilled in the art without actually departing from the invention. I, therefore, aim in the appended claims to cover all such equivalent variations as come within the true spirit and scope of the foregoing disclosure.

What I claim as new and desire to secure by Letters Patent of the United States is:

1. An energy conversion system comprising a first elongated, conductive wave guide having opposed wall portions, an elongated slot in each of said wall portions and a pair of spaced elongated conductive members within said wave guide, each member extending from a location near one edge of each of said slots to a location near the edge of the other of said slots to form a pair of elongated, spaced gaps, a second wave guide having opposed surface portions each having an elongated slot therein to form another gap, all of said gaps being in alignment with each other, means projecting a single beam of electrons through said gaps along the length of said slots, means propagating an electromagnetic wave of predetermined frequency along said first wave guide with its electric field across said gaps and means propagating an electromagnetic wave along said second wave guide of a frequency greater than said predetermined frequency for modulating said beam whereby the susceptance of said one of said gaps of said first wave guide is varied in accordance with said modulation to convert the electromagnetic wave energy propagated in said first wave guide.

2. An energy conversion system comprising a pair or substantially parallel, conductive, coextensive wave guides each having longitudinal opposed surface portions, an elongated slot in each of said surface portions in alignment with each of the other of said slots, elongated, conductive means in a first of said wave guides extending between the slots therein to form a pair of elongated gaps along said wave guide having a hollow drift space therebetween, conductive means in the other of said wave guides extending from the edges of one of said slots into proximity of the other slot thereof, means producing a sheet beam of electrons through said slots, means for propagating an electromagnetic wave of predetermined frequency along said first wave guide having its electric field across said gaps and means for propagating an electromagnetic wave along the other of said wave guides having its electric field across the gap thereof for modulating said electron beam whereby the electrical susceptance across one of the gaps of said one wave guide is varied in accordance with said modulating wave to convert the energy propagated in said one wave giude.

3. An energy conversion system comprising wave guide means for supporting propagation of electromagnetic energy of a predetermined frequency therethrough and having a pair of spaced gaps extending longitudinally therealong with a field free drift space between said gaps means for producing an electron beam through said gaps and said drift space and having a drift period through said drift space approximately equal to an odd number of half periods of said electromagnetic wave propagated in said wave guide means whereby electrons in said beam are velocity modulated at the first of said gaps and pass through the second of said gaps in bunches during potential minima at said second gap to introduce a susceptance in said wave guide means and means for modulating said susceptance including means for modulating said electron beam prior to passage through said first gap at a frequency greater than said predetermined frequency.

4. An energy conversion system comprising a wave guide for supporting propagation of electromagnetic wave energy therethrough, a pair of longitudinal slots in opposed walls extending longitudinally along a portion of said wave guide and conductive means between said slots and spaced therefrom forming a pair of spaced gaps and a field free drift space therebetween, means for producing an electron beam through said slots and said drift space having a drift period substantially equal to a half period of said electromagnetic wave whereby electrons in said beam are velocity modulated at a first of said gaps and pass through the second of said gaps in bunches during potential minima at said second gap to introduce a susceptance in said wave guide and means for modulating said susceptance including means for modulating said electron beam prior to passage through said first gap at a frequency greater than the frequency of said electromagnetic wave.

5. An energy conversion system comprising a first wave guide for supporting propagation of electromagnetic wave energy therethrough, a pair of longitudinal slots in opposed walls of said wave guide and extending along a portion thereof, conductive means between said slots and spaced therefrom forming a pair of spaced gaps and a field free drift space therebetween, means for producing an electron beam passing through said gaps and said drift space and having a drift period between said gaps substantially equal to an odd number of half periods of said electromagnetic wave whereby electrons in said beam are velocity modulated at a first of said gaps and pass through the second of said gaps in bunches during potential minima at said second gap to introduce a susceptance in said wave guide, a second wave guide interposed between said first wave guide and said beam producing means and having a pair of opposed, longitudinal slots for accommodating said electron beam, means for propagating an electromagnetic wave in said second wave guide having a frequency greater than said predetermined frequency for modulating said beam at said greater frequency whereby the susceptance introduced by said beam in said first wave guide is modulated in accordance with the electromagnetic wave introduced in said second wave guide to produce energy conversion in said first wave guide.

6. An energy conversion system comprising waveguide means for supporting propagation of electromagnetic wave energy therethrough and defining a pair of spaced gaps extending longitudinally therealong with a field free drift space between said gaps, means for producing electrons and passing them through said gaps and said drift space, said electrons having a drift period through said drift space approximately equal to an odd number of half periods of electromagnetic wave propagated in said waveguide whereby electrons in said beam are velocity modulated at the first of said gaps and pass through the second of said gaps in bunches during potential minima of said second gap to introduce a susceptance in said waveguide means, a second waveguide means interposed between said first guide and said electron producing means and having wall portions defining opposed longitudinal slots for accommodating said electron beam and providing a modulating gap therebetween, means for propagating an electromagnetic wave in said second electric waveguide means having a frequency differing from the electromagnetic wave propagated in said first waveguide means for modulating said electrons at said different frequency and thereby modulating the susceptance introduced by said electrons in said first waveguide means in accordance with said different frequency to produce energy conversion in said first waveguide means.

References Cited in the file of this patent

UNITED STATES PATENTS

| | | |
|---|---|---|
| 2,410,054 | Fremlin et al. | Oct. 29, 1946 |
| 2,411,535 | Fremlin | Nov. 26, 1946 |
| 2,485,661 | Roach | Oct. 25, 1949 |
| 2,547,061 | Touraton et al. | Apr. 3, 1951 |
| 2,565,708 | Warnecke et al. | Aug. 28, 1951 |
| 2,579,480 | Feenberg | Dec. 25, 1951 |
| 2,605,444 | Garbuny | July 29, 1952 |
| 2,614,234 | Voge | Oct. 14, 1952 |
| 2,657,329 | Wathen | Oct. 27, 1953 |
| 2,698,398 | Ginzton | Dec. 28, 1954 |
| 2,855,538 | Thonemann | Oct. 7, 1958 |
| 2,932,762 | Geppert | Apr. 12, 1960 |
| 2,953,713 | Geiger | Sept. 20, 1960 |